United States Patent [19]
Brown

[11] Patent Number: 5,483,195
[45] Date of Patent: Jan. 9, 1996

[54] SECOND GENERATION LOW NOISE MICROWAVE VOLTAGE CONTROLLED OSCILLATOR

[75] Inventor: Anthony K. D. Brown, Kanata, Canada

[73] Assignee: Northern Telecom Limited, Quebec, Canada

[21] Appl. No.: 327,155

[22] Filed: Oct. 20, 1994

[51] Int. Cl.⁶ .................................. H03F 3/45; H03B 5/02
[52] U.S. Cl. .................... 330/254; 330/259; 330/305; 330/306; 331/57; 331/108 B
[58] Field of Search .................................. 330/254, 259, 330/305, 306; 331/57, 108 B

[56] References Cited

U.S. PATENT DOCUMENTS

| | | | |
|---|---|---|---|
| 5,079,515 | 1/1992 | Tanimoto | 330/256 |
| 5,093,634 | 3/1992 | Khoury | 330/253 X |
| 5,172,076 | 12/1992 | Brown | 331/57 |
| 5,185,581 | 2/1993 | Brown | 330/254 |

OTHER PUBLICATIONS

"Phase Noise in Signal Sources", W. P. Robins, IEE Telecommunications Series 9, Peter Peregrinus Ltd., 1982, pp. 47–53.
"An 8GHz Silicon Bipolar Clock–Recovery and Data–Regenerator IC", Pottbacker et al, Digest of Technical Papers, 1994 IEEE International Solid–State Circuits Conference, p. 116.

Primary Examiner—James B. Mullins
Attorney, Agent, or Firm—George MacGregor

[57] ABSTRACT

A low noise linear amplifier and a microwave voltage controlled oscillator constructed from such amplifier. Each amplifier within the VCO utilizes a ratioed transistor configuration to generate a linear output over a wide range of inputs. Output current from the amplifier is split into a main output current and components of in-phase and 180° out-of-phase current. A logarithmic tuning control combines the components of in-phase and 180° out-of-phase currents in inverse ratio to provide a constant d.c. feedback current.

12 Claims, 9 Drawing Sheets

SECOND GENERATION LOW NOISE MICROWAVE VOLTAGE CONTROLLED OSCILLATOR

FIELD OF THE INVENTION

This invention relates to linear amplifiers having variable delay and to low noise, high frequency voltage controlled oscillators constructed from such amplifiers.

1. Background

With the advent of cellular radio telephone distribution systems and the growing information era, the importance of VHF and UHF personal communication systems has grown. Implicit in this is the requirement for low cost integrated solutions for clock recovery and analog UHF signal processing. A major subcomponent of such communication systems is the voltage controlled oscillator (VCO) which must operate at UHF frequencies, at very low noise (jitter). Currently, integrated solutions for the UHF oscillator are sought for cost reasons.

2. Prior Art

In Applicant's prior U.S. Pat. Nos. 5,172,076, and 5,185,581, issued Dec. 15, 1992 and Feb. 9, 1993 respectively, small signal, voltage controlled oscillators constructed with differential amplifiers are disclosed. These VCO's, which are capable of operation to 1 GHz, can generate up to about 0.15 V peak to peak while providing a measured noise jitter which is typically about 5 ps rms, or 0.005 Unit Intervals (UI). A UI is the rms jitter divided by the oscillator period. For many applications a jitter of approximately 0.01 UI is adequate but for future analog/digital converter techniques, jitter of 0.001 UI at 1 GHz or better will be required. This represents a required improvement of 14 dB over that which is achieved by the aforementioned prior patents. The present invention relates to a VCO which addresses this requirement.

SUMMARY OF THE INVENTION

It is an object of the present invention to provide a linear amplifier which generates low noise at microwave frequencies.

It is a further object of the invention to provide a low noise, voltage controlled oscillator from a pair of interconnected linear amplifiers.

It is yet a further object of the invention to provide a voltage controlled oscillator having a high degree of linearity at high signal levels.

In accordance with a first aspect of the present invention there is provided a linear amplifier having variable delay means. The amplifier has first, second and third bipolar differential pairs and first, second and third current sources connected to the first, second and third differential pairs respectively. Differential current outputs are generated by the differential pairs. A gain linearizing offset voltage is provided by ratioed transistors in the input emitter followers and associated current mirrors.

A linear phase splitter receives the differential current outputs and provides main current outputs and components of in-phase and 180° out-of-phase current. A logarithmic tuning control combines the components of in-phase and 180° out-of-phase currents in inverse ratio to provide a constant d.c. feedback current.

In a preferred embodiment the feedback current is summed with the main current in a tapped load resistance.

In accordance with a further aspect of the invention a pair of linear amplifiers are interconnected such that the positive and negative outputs of the first amplifier are connected to the positive and negative inputs respectively of the second amplifier while the negative output of the second amplifier is connected to the positive input of the first amplifier and the positive output of the second amplifier is connected to the negative input of the first amplifier. A 90° phase shift exists between the outputs of each amplifier.

BRIEF DESCRIPTION OF THE DRAWINGS

The invention will now be described in greater detail with reference to the attached drawings wherein.

DETAILED DESCRIPTION OF THE INVENTION

Figure 1:
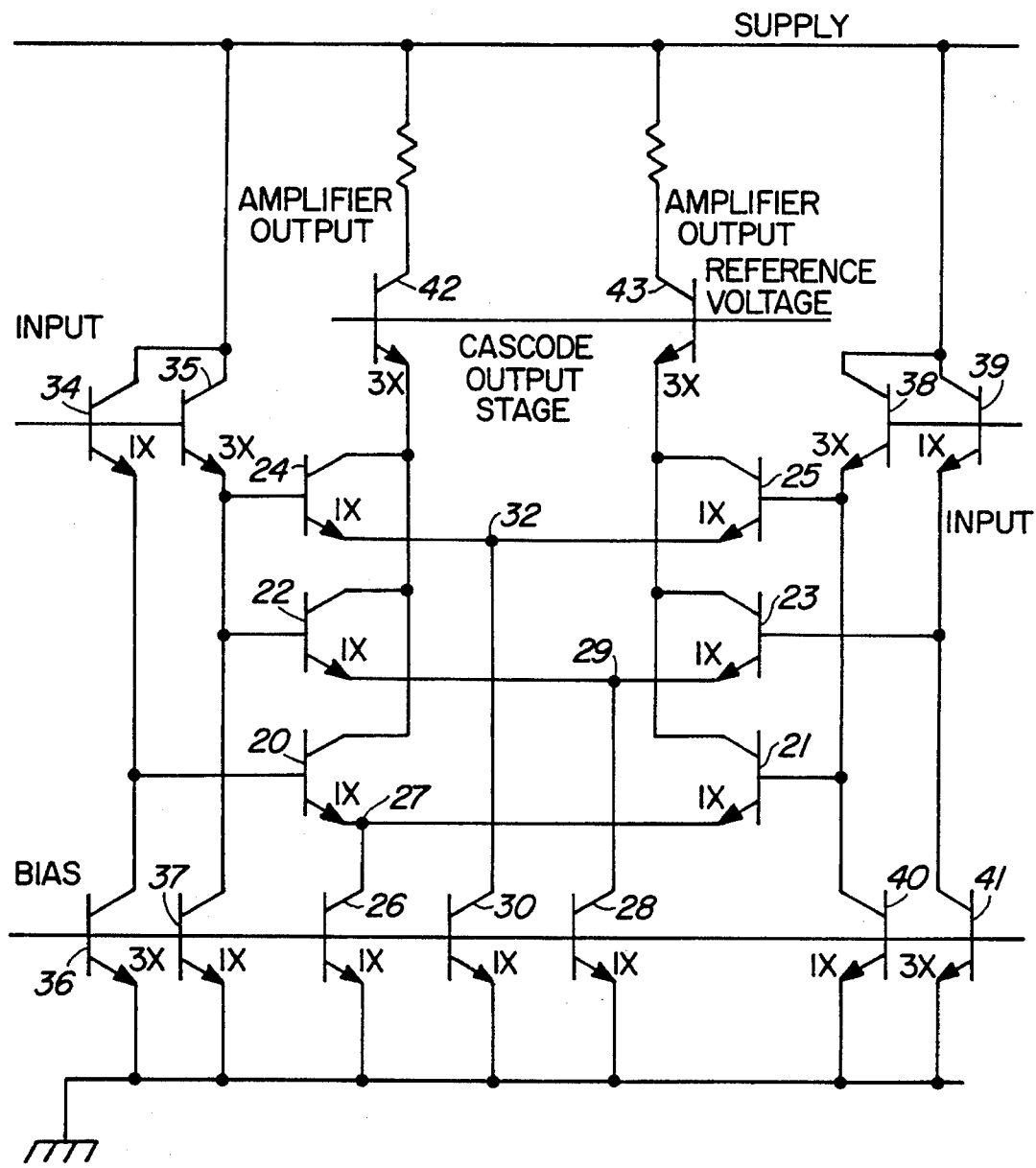
FIG. 1 is a circuit diagram of a linear amplifier according to the prior art.

The amplifier of Applicant's U.S. Pat. No. 5,185,581 (the disclosure of which is incorporated herein by reference), as part of the low noise VCO operates on the principle of a gyrator with positive feedback so that the dominant poles are located in the right hand s-plane. Tuning is accomplished by varying the amplifier gain, which in turn varies the Miller feedback capacitance and hence controls the gyrator resonant frequency. The Q factor of the resonator is dependent upon the loss in the circuit as well as the amplifier non-linearity and the amplifier built-in-delay. Equations which describe how the resonator Q factor may be maximized are given in Applicant's copending U.S. patent application Ser. No. 08/070,828, the disclosure of which is incorporated herein by reference. These describe two orthogonal small signal unity gain conditions as:

$$W_0 = g_m/(C+GD) \qquad (EQ\ 1)$$

$$D = G/(w_0^2 C) \qquad (EQ\ 2)$$

Here Equation 1 describes the resonant angular frequency $W_0$ in terms of the amplifier transconductance $g_m$, the gyrator capacitance C and a negligible second order term which is the product of the gyrator loss admittance G and the amplifier built-in-delay D. Equation 2 describes an orthogonal condition which controls the resonator Q factor such that the Q is infinite when this condition is satisfied. In practice the delay D must be slightly greater than the unity gain value to ensure oscillation.

An equation due to Robins (W. P. Robins, "Phase Noise In Signal Sources", page 52, Peregrims Ltd., 1984), teaches that the effective quality factor Q' of an oscillator which is directly related to the oscillator noise performance is dependent upon the oscillator power in the load P, the amplifier noise factor N and the resonator Q factor according to Equation 3:

$$Q'=2QP/\pi NkTB \qquad (EQ3)$$

Here k is Boltzmann's constant, T the absolute temperature, and B the resonator 3 dB bandwidth. This may be rewritten as Equation 4:

$$Q'=4Q^2P/NkT\omega_0 \qquad (EQ4)$$

From Equation 4 it is clear that for a given resonant angular frequency $w_0$ the noise performance is proportional to the square of the resonator Q factor and the power P in the load. The objectives of the present invention are to approximate the ideal small signal conditions established in Equation 1 and Equation 2 for large signals so as to maximize both the large signal Q factor and the power P. This translates into the requirement that the amplifiers of the aforementioned U.S. Pat. Nos. 5,172,076 and 5,185,581 be replaced by an amplifier having greater signal handling capability and improved linearity. At the same time the amplifier must be tunable in some respect to vary the frequency.

The essential principle used for obtaining a linear amplifier at microwave frequencies is described in Applicant's co-pending U.S. patent application Ser. No. 08/257,975, now U.S. Pat. No. 5,420,538 and is shown in one form in FIG. 1. Such an amplifier can have a gain as high as 27 dB with a 3 dB bandwidth of 2 GHz in a typical bipolar process with an $f_T$ of about 10 GHz. In addition this amplifier is capable of amplifying signals of 140 mV peak/peak at the input with less than 1 percent total harmonic distortion. Depending upon the selected amplifier gain, this can provide at least 1.5 volts peak/peak in the load, which is an order of magnitude greater than the signal provided in the prior art. A significant feature of this amplifier is that the gain can be varied by an automatic gain control which operates on the bias voltage applied to the current mirror. Thus the amplitude of the oscillations can be controlled to operate entirely within the linear region of the amplifier, thus maximizing the large signal Q factor of the resonator.

An additional requirement of the amplifier is that it must be tunable in some fashion to operate as a VCO. One method which provides a small degree of control (about 10 percent), is to provide two signal paths within the amplifier of FIG. 1, one with greater built in delay, and a means of tuning which varies the signal between the two paths. Such a method is valid since the combination of two sinusoidal signals with different path delay remains an undistorted sine wave. However, for practical purposes, 10 percent tuning range is considered insufficient for coping with normal integrated circuit manufacturing tolerances.

Figure 2:
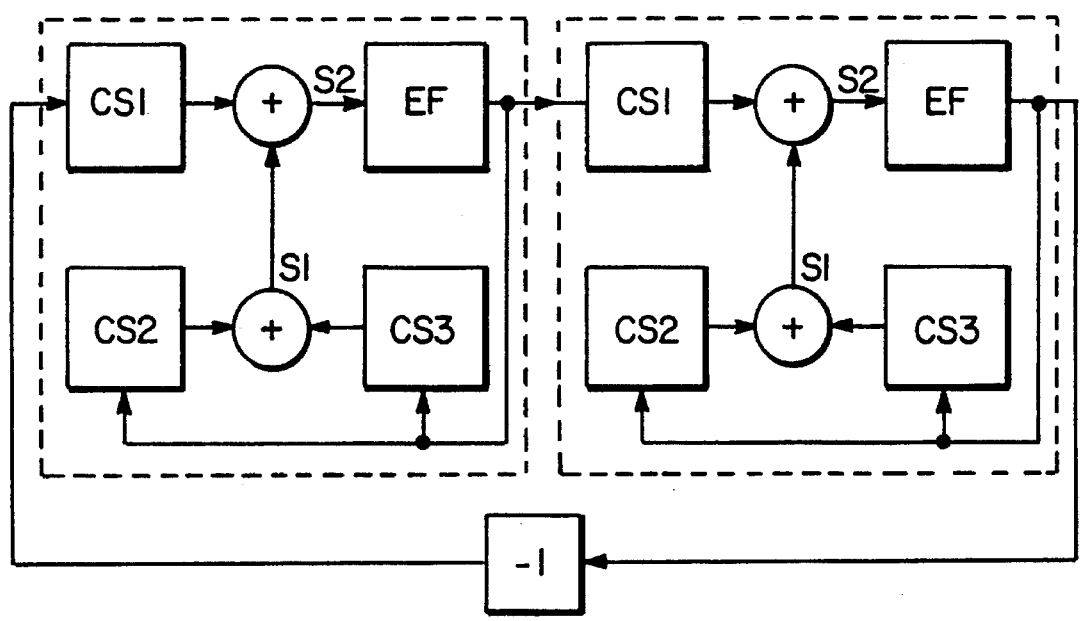
FIG. 2 is a block diagram of a prior art method of tuning a two-stage ring oscillator.

Another method of tuning a two stage ring-oscillator is described by Pottbacker & Langmann, "An 8 GHz Silicon Bipolar Clock-Recovery and Data-Regenerator IC", Digest of Technical Papers, 1994 IEEE International Solid-State Circuits Conference, p. 116. In this arrangement, as shown in FIG. 2, the currents in the emitter followers EF and in the amplifiers CS2 and CS3 are adjusted to obtain a phase delay at the summing point S1 which matches the delay in amplifier CS1. The summing point S1 is used to vary the amount by which signal vectors of ±90° are added to the output of amplifier CS1 at summing point S2, thus varying the combined signal phase and hence its frequency. This circuit suffers from the need to adjust the bias levels of the amplifiers CS1, CS2 and CS3 as well as the emitter followers EF in order to obtain signal phasors at approximately ±90°. Such bias level adjustments are process and temperature dependent and are cumbersome. In addition, the amplifiers of this prior art have high levels of non-linearity.

Figure 6A:
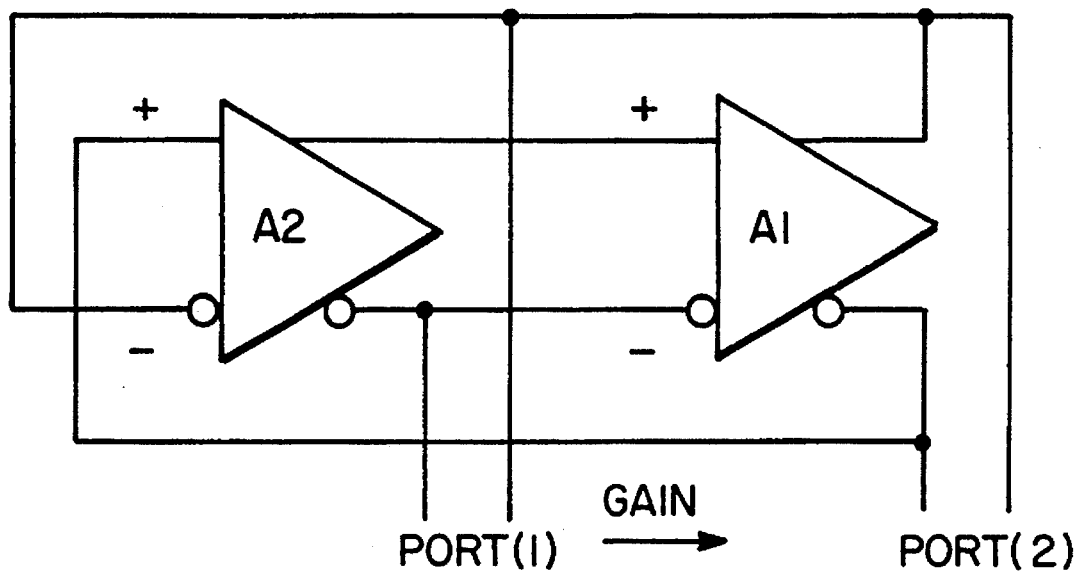
FIG. 6A illustrates the interconnection of two linear amplifiers to form a voltage controlled oscillator.

The present invention provides an improved approach to controlling the oscillator frequency by taking advantage of the precise 90° phase shift which is automatically established across two amplifiers of a gyrator resonator as shown in Applicant's aforementioned U.S. patents and more particularly in FIG. 6A herein. From this arrangement both in-phase and 180° out-of-phase components of the amplifier output automatically appear as precise ±90° phasors at the amplifier input. According to the invention, tuning is accomplished by steering these components in inverse varying amounts to obtain a constant d.c. current sum at the input.

Figure 3:
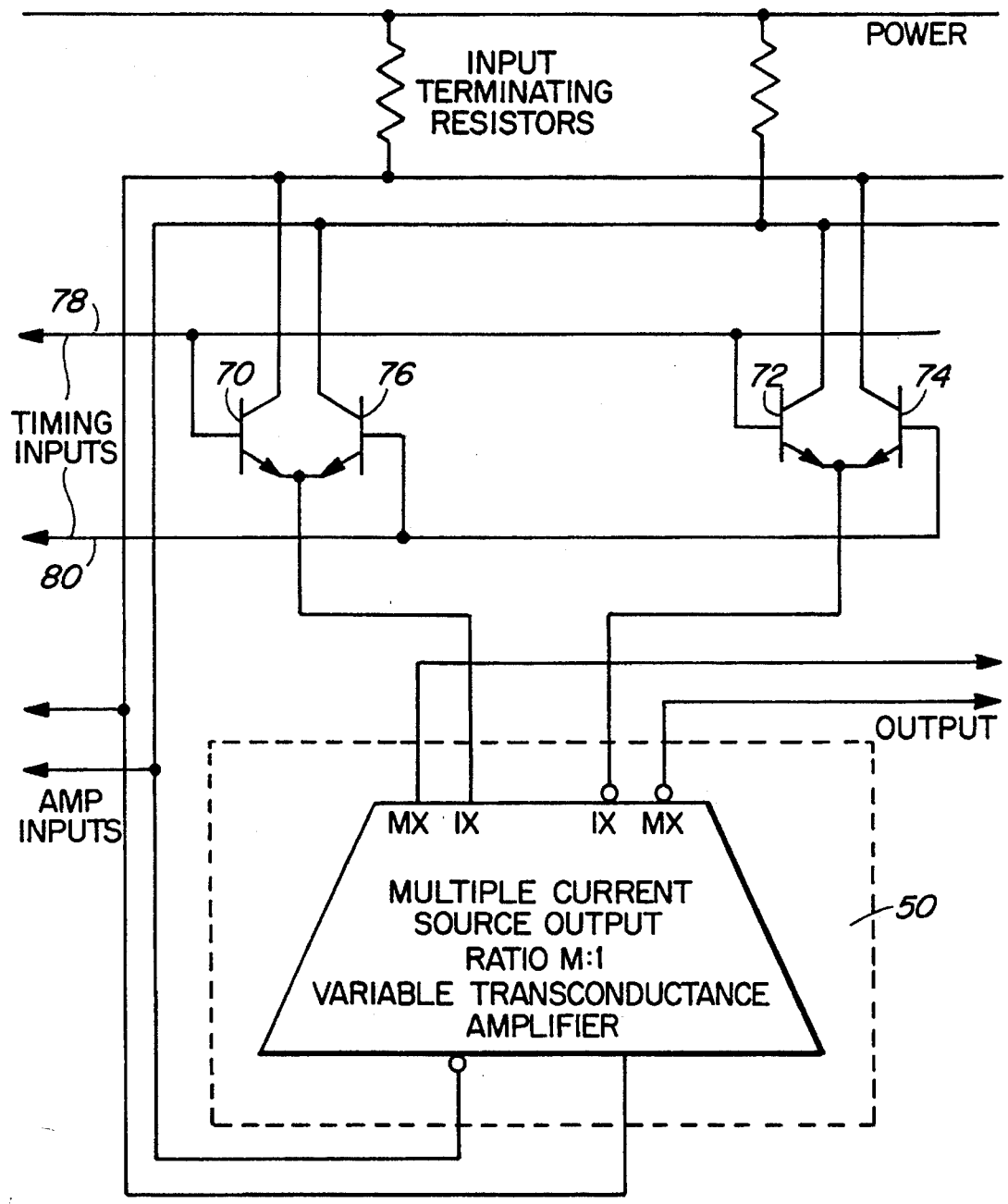
FIG. 3 is a conceptual diagram of the present invention including the tuning circuit.

FIG. 3 illustrates conceptually the tuning arrangement for one amplifier of the gyrator. In FIG. 3, the amplifier/current source 50 includes the linear amplifier best seen in FIG. 1. The linear amplifier has three differential pairs comprising transistors 20, 21 as a first pair, transistors 22, 23 as a second pair, and transistors 24, 25 as a third pair. The pair comprising transistors 20, 21 has a current source 26 connected to node 27; the pair comprising transistors 22, 23 has current source 28, connected to node 29, and the pair 24, 25 has current source 30 connected to node 32. Ratioed emitter followers 34, 35 and inversely ratioed current mirrors 36, 37 provide input to transistors 20, 22 and 24 while ratioed emitter followers 38, 39 and inversely ratioed current mirrors 40, 41 provide input to transistors 21, 23 and 25. The amplifier output is developed across cascode output stage comprising transistors 42, 43. The output is linear over a wide range as discussed in Applicant's copending U.S. application Ser. No. 08/257,975.

Figure 4:
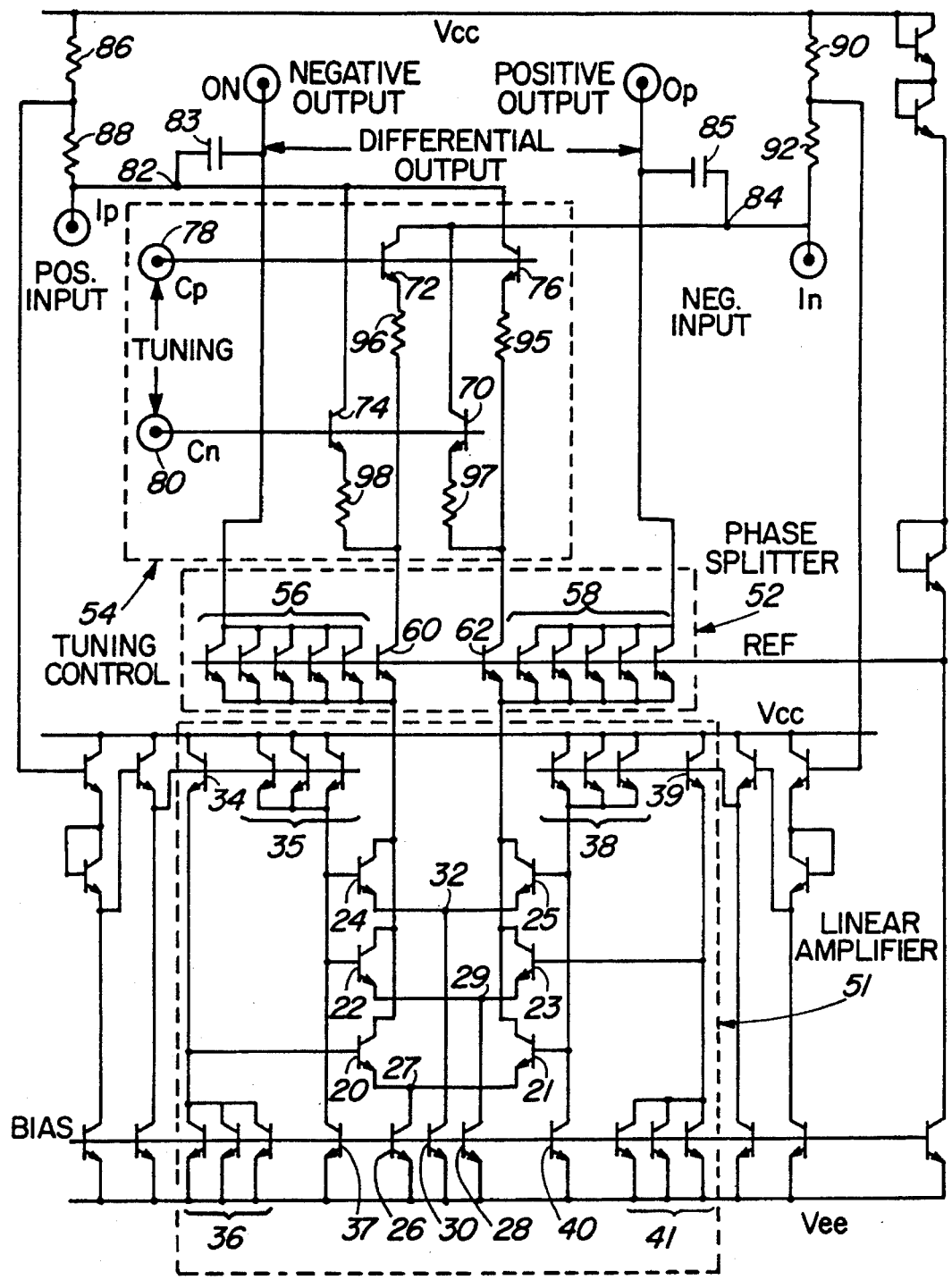
FIG. 4 is a detailed circuit diagram of the linear amplifier according to the present invention.

The linear amplifier shown in FIG. 1 and included in box 50 of FIG. 3 is shown in detail in dashed box 51 of FIG. 4. The outputs from the linear amplifier are supplied to phase splitter 52 comprising cascode transistors 56, 60 and 58, 62 having a ratio illustrated of M=5. As shown the output of the two 5x transistors 56, 58 is a differential output. The output differential from the 1x transistors 60, 62 is supplied to tuning control 54 as also seen in the conceptual drawing in FIG. 3. Referring again to FIG. 3, the main outputs are the MX outputs of the amplifier/current source 50. The 1x outputs are connected to differential pairs each comprising emitter coupled transistors. The base voltage of each pair is supplied by tuning inputs. The collector outputs are taken across load resistors which output is connected to the amplifier inputs as shown. FIG. 4 shows the amplifier circuit in greater detail particularly with respect to the output taken across the input of respective amplifiers. As shown the load resistors 88, 86, 92 90 are tapped to provide an attenuated input level to avoid overloading the amplifier. Also shown in FIG. 4 are gyrator Miller capacitors 83 and 85. In FIG. 4, the outputs from the 1x transistors 60, 62 in the phase splitter 52 are supplied to 1x transistors 70, 72, 74 and 76 in tuning control 54. The bases of the 1x transistors 70, 72, 74 and 76 are provided with a differential control signal via positive input 78 and negative input 80. The outputs of phase splitter 1x transistors 60 and 62 are supplied to input nodes 82, 84 in response to the value of the voltage input at the differential tuning control input lines 78 and 80. The outputs at nodes 82, 84 appear across tapped load resistors 86, 88, 90 and 92 where they are summed with the outputs from the 5x transistors 56,58 in the phase splitter of the gyrator's other amplifier as will be described in relation to FIG. 6A. Hence the differential control input steers the output current to the tapped load resistors which in turn provides the input voltage to the linear amplifier.

Figure 5:
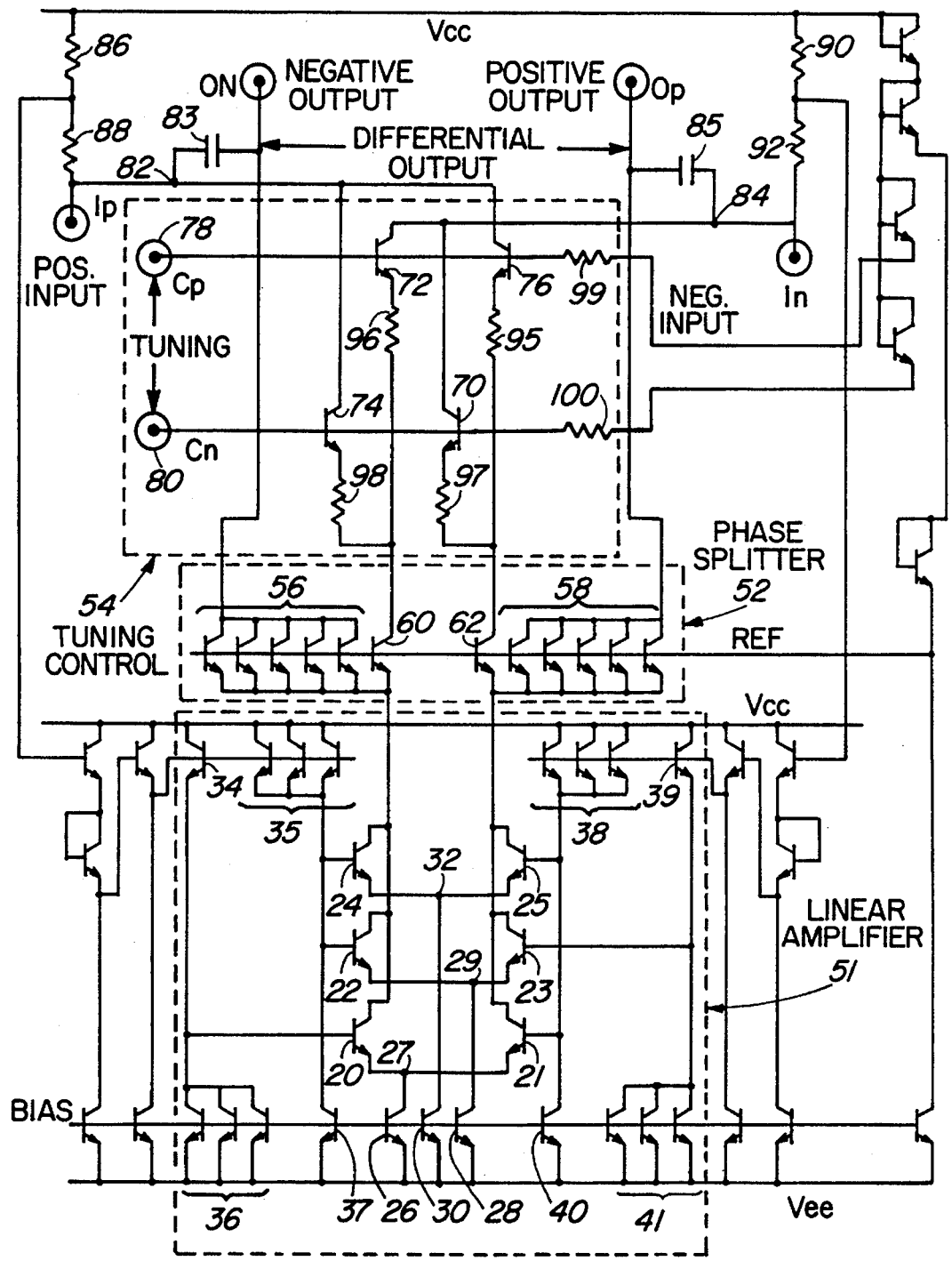
FIG. 5 is the amplifier of FIG. 4 with a modified tuning circuit.

FIG. 5 illustrates an alternative to the circuit of FIG. 4. In FIG. 5 the tuning control is a differential current supplied to transistors 70, 72, 74 and 76 rather than a differential voltage as shown in FIG. 4.

FIG. 4 also illustrates resistors 95, 96, 97, 98 which reduce the affect of noise in the tuning control. FIG. 5 includes resistors 99, 100 which have the same purpose. All these resistors have equal value normally not greater than that of the load resistors (86+88) and (90+92).

A voltage controlled oscillator according to one embodiment of the invention comprises a pair of linear amplifiers in a gyrator resonator configuration as shown in FIG. 6A. In this figure two amplifiers, $A_1$ and $A_2$, are interconnected with the output of $A_2$ coupled to the input of $A_1$. The positive output of $A_1$ is connected to the negative input of $A_2$ while the negative output of $A_1$ is connected to the positive input of $A_2$.

Figure 6B:
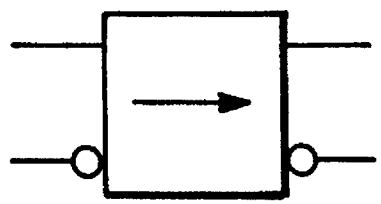
FIG. 6B provides the symbol used for the voltage controlled oscillator of FIG. 6A.

FIG. 6B is a representation of the symbol for the gyrator resonator of FIG. 6A.

Figure 7:
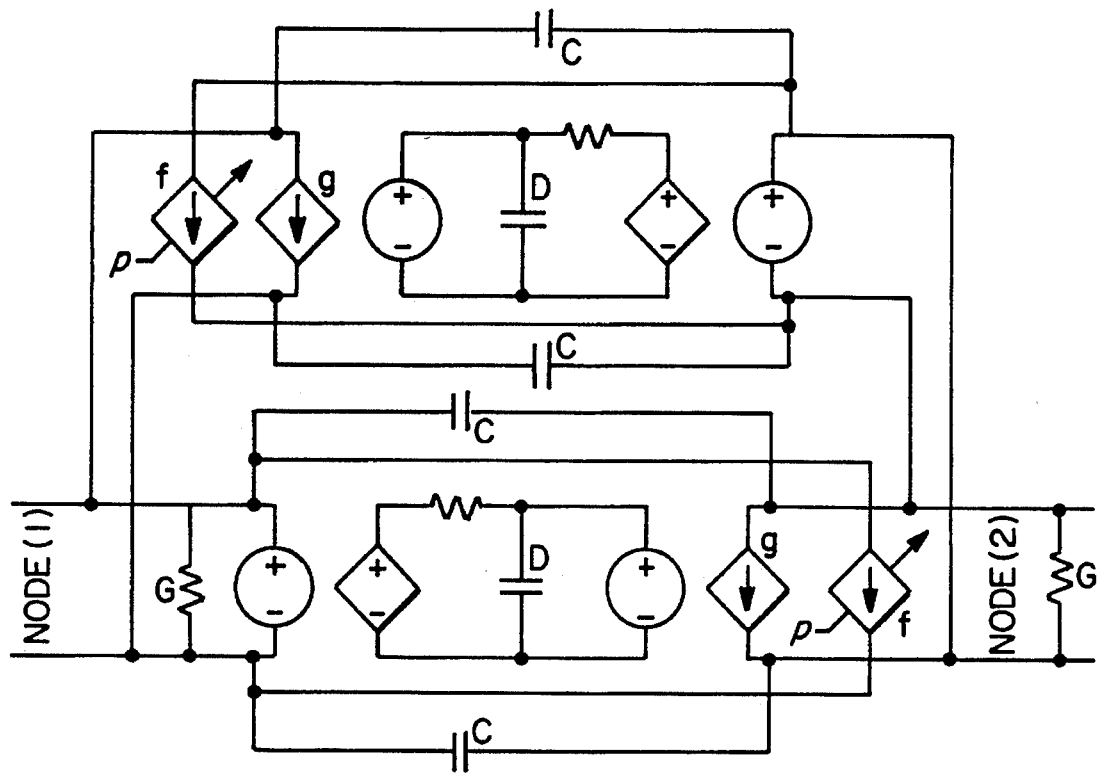
FIG. 7 illustrates a gyrator model with Miller feedback, delay and tuning.

The tuning arrangement of the present invention may be better understood with reference to the gyrator model shown in FIG. 7. The gyrator has Miller feedback, delay and tuning wherein tuning is accomplished by current feedback from Node (1) to Node (2) and vice versa, as illustrated by the darker lines of FIG. 7. The normalized frequency shift is dependent on the current feedback ratio. In FIG. 7 the current feedback ratio p=f/g $$\text{and } \frac{\delta\omega}{\omega} = \frac{a\tan\rho}{\left(a\tan\rho + \frac{\pi}{2}\right)} \quad \text{(EQ 5)}$$

where $$\frac{\delta\omega}{\omega} = \text{frequency shift.}$$

Figure 8A:
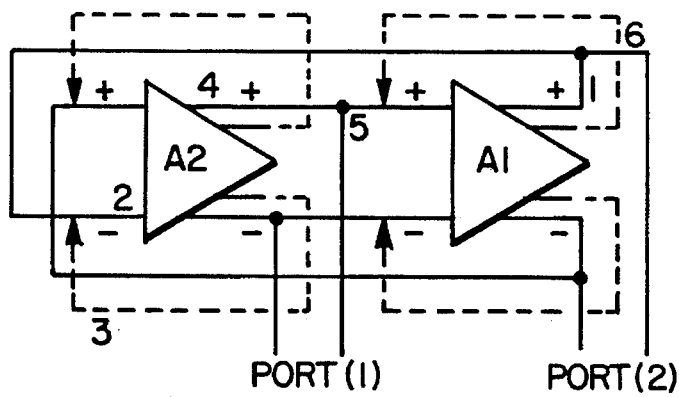
FIG. 8A is a block diagram of the tuning arrangement of FIG. 7 applied to the present invention.
Figure 8B:
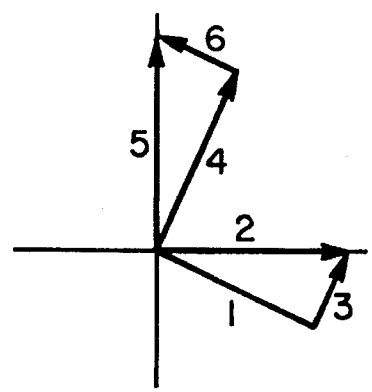
FIG. 8B is a simplified view of the current vector addition.

FIG. 8A illustrates the tuning arrangement in relation to the VCO shown in FIG. 6A. In this figure the gyrator ports are in quadrature phase. Current feedback from one port to the other adds with that port's transconductor output creating a new combined output which is the vector sum of the combined components. Hence in FIG. 8A variable current feedback paths 3 and 6 shown in dashed line are summed with outputs 1 and 4 respectively. A simplified view of this vector addition is shown in FIG. 8B which shows vectors 1 and 3 summed to give vector 2 and vectors 4 and 6 summed to give vector 5.

In FIGS. 4 and 5 the ratio M of the cascode mirror of the phase splitter is 1:5, specifically, this is the ratio of transistor 60 to 56 and of transistor 62 to 58. Substituting in Equation 5

$$\frac{\delta\omega}{\omega} = 14.7\% \text{ and } -12.8\%.$$

Figure 9:
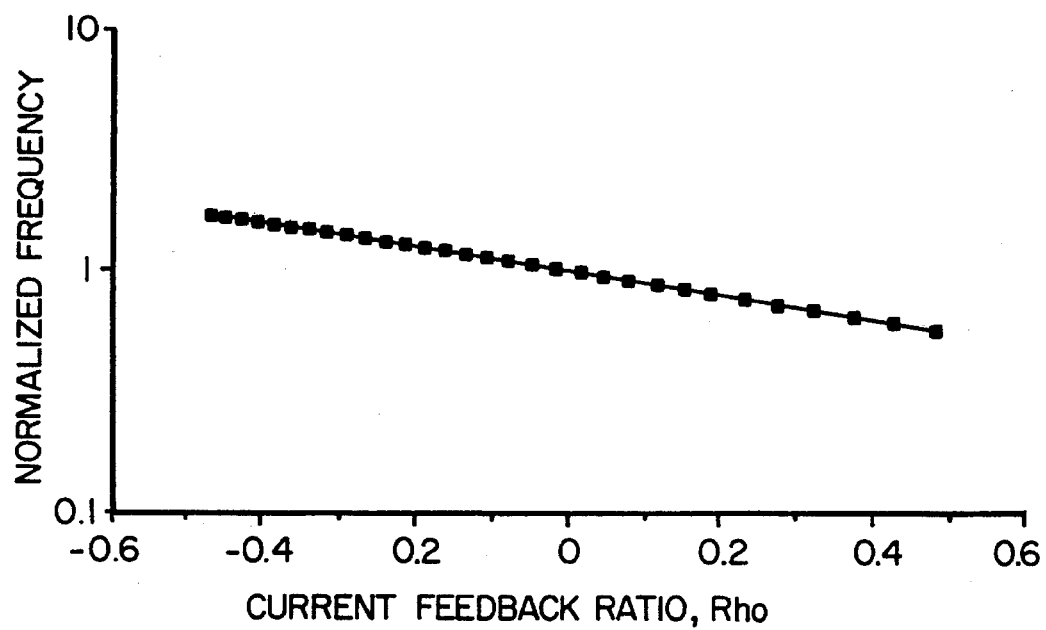
FIG. 9 is a graph showing the logarithmic tuning range.

Over a broad frequency range the tuning range is logarithmic as shown in FIG. 9. The tuning range is independent of ambient temperature and processing variables.

In the case of a tightly controlled bipolar process the amount of control required to compensate for processing is less and by lowering the amount of feedback current available the voltage/frequency gain of the oscillator is lowered and the phase noise is improved.

As indicated previously, it is an object of the present invention that the small signal conditions described by Equation 1 and Equation 2 which maximize the resonator Q factor and minimize the phase noise, according to Applicant's U.S. application Ser. No. 08/070,828, should be closely approximated at large signal levels. This requires that the amplifier be operated in the linear region, i.e., with constant gain. Unlike the tuning method disclosed in Applicant's U.S. Pat. Nos. 5,172,076 and 5,185,581, in which the amplifier gain is varied to alter the Miller capacitance, the tuning mechanism of the oscillator of the present invention achieves its object by indirectly altering the amplifier transconductance ($g_m$) and so altering the resonant frequency ($W_0$) according to Equation 1. This is done by directly adjusting the amplifier delay D. At the same time, automatic gain control is applied to the bias input so that Equation 2 is approximately realized by operating in the amplifier linear region. According to Equation 2, since both the loss admittance G and the Miller capacitance C are kept constant, the compensating variable for variation of delay D is $W_0^2$. By reference to Equation 1, the Miller capacitance C is constant, the product GD is a small second order term, and thus $W_0$ is varied to approximately satisfy Equation 2 by variation of the amplifier transconductance $g_m$. Thus the Q is maximized at large signal levels.

Figure 10:
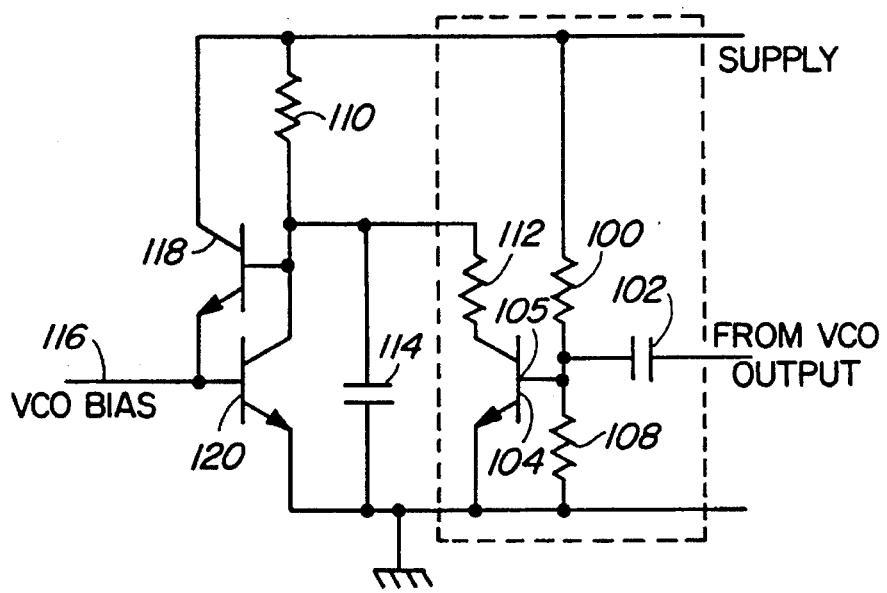
FIG. 10 is a circuit diagram of a basic automatic gain control.

The basic Automatic Gain Control (AGC) circuit for the VCO of the present invention is shown in FIG. 10. The output from this VCO is capacitively coupled via capacitor 102 to a level detector comprising bipolar transistor 104 and resistors 106 and 108. The base 105 of transistor 104 is biased below cut-off at about 0.75 $V_{be}$. When the output from the VCO increases above about 0.25 $V_{be}$ transistor 104 begins to conduct through resistors 110, 112. This causes capacitor 114 to discharge thereby lowering the VCO bias voltage on line 116. This results in a lowering of the VCO output voltage until a state of equilibrium is established with approximately 0.5 $V_{be}$ pp voltage at each output.

This basic design can be embellished in various ways. For example a fixed gain differential amplifier between the VCO outputs and the AGC control inputs can be used to eliminate common mode feedback. Also the supply voltage can be regulated. Further, regulation of the AGC supply voltage in a manner proportional to 1/T using three silicon diodes in series results in temperature stability of the VCO to better than 500 ppm/° C.

Figure 11:
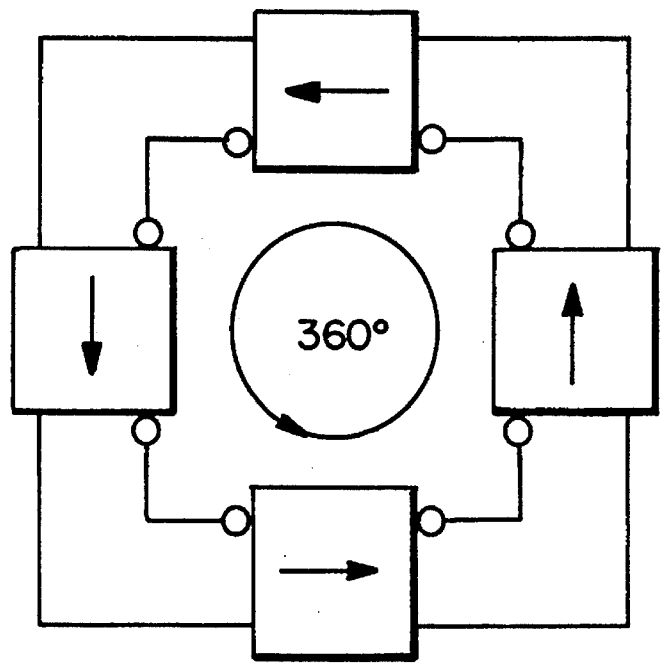
FIGS. 11 and 12 illustrate multi-resonator designs.
Figure 12:
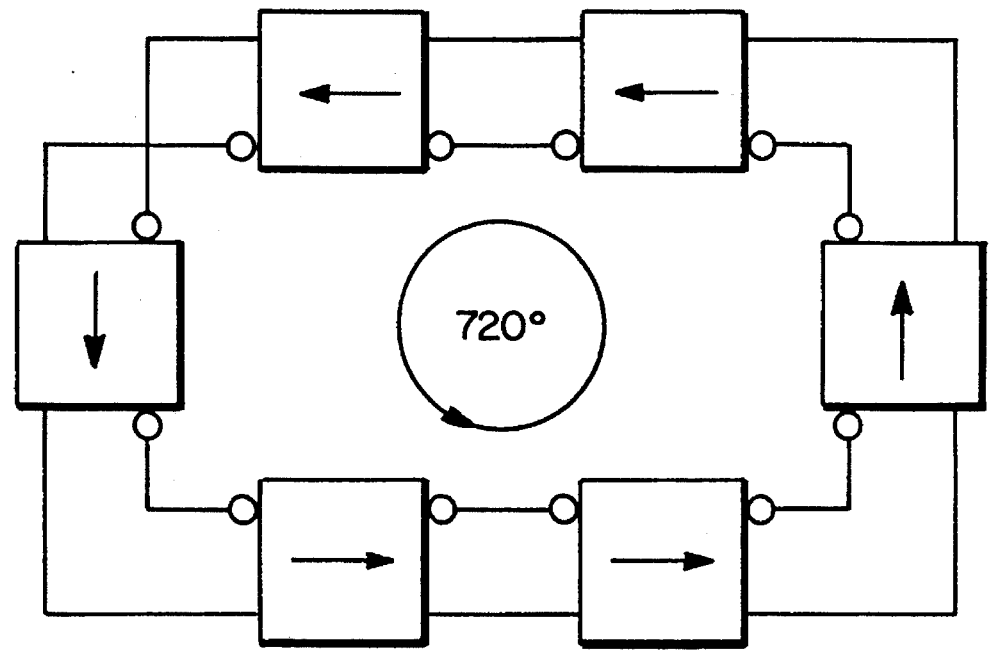

A further feature of the VCO of the present invention is that due to the gain of the amplifier, the load resistor is tapped to provide an appropriate input signal level to the low distortion amplifier. This is illustrated in FIG. 4 as the ratio of tapped load resistors 88 and 86 (the same ratio is employed for corresponding load resistors 92 and 90). This tap ratio may be different for the two amplifiers of a gyrator so as to provide two port gain as illustrated in FIG. 6A in which the gyrator ports are the amplifier differential output On and Op of FIG. 4. The tap ratio can be varied according to the requirements so as to provide for multiple resonator configurations in which a ring of resonator establishes a ring mode of oscillation with the resonators operating in cascade. FIGS. 11 and 12 illustrate examples of multiple resonator designs in which the connectivity is implied by the symbol defined in FIG. 6B. Thus port 1 of one resonator is connected to port 2 of the next resonator in a ring with the result that the two port gain is additive around the ring of resonators. This arrangement of resonators follows the prior art of the Applicant's U.S. Pat. Nos. 5,172,067 and 5,185,581. The cascade filtering provided by the ring enhances the Q of the oscillator. It has been found by simulation that a single resonator oscillator based on the present invention can have a harmonic distortion of about 1% at 1.5 volts peak/peak output level. In this case the dominant distortion is third harmonic. By arranging six resonators in a ring as shown in FIG. 12, the cascaded resonators provide additional high frequency filtering of harmonics. Thus the present invention is a means for providing low harmonic, low noise, signal sources at microwave frequencies.

As previously discussed it is possible to achieve a total harmonic distortion level of 1% or better at an output level of 1.5 volts peak to peak in a ring of multiple resonators. Such a distortion level is due to residual non-linearity of about 1% at this signal amplitude. Under steady state operation established by the automatic gain control the integral of the gain over one cycle of the oscillator is exactly unity. This is true for both single and multiple resonator oscillators. In the case of multiple resonators it is the integral of the ring gain over one cycle that is unity. Also, the small signal gain is slightly greater than unity due to the residual gain non-linearity. However, for resonator transconductance ratio R>1, the resonator loop gain is always less than the multiple resonator ring gain. Consequently, it is possible to adjust the ratio R, such that for small signal ring gain slightly greater than unity, the resonator loop gain is closer to unity, thus maximizing the individual resonator Q factors at small signal levels and improving the overall Q factor of the oscillator.

It can be shown that the optimum value for R is (1+THD) where THD is the total harmonic distortion generated at one output of the gyrator at its normal operating signal level.

Although specific embodiments of the invention have been illustrated and described it will be apparent to one skilled in the art that variations and alternatives to these embodiments are possible. It is to be understood, however, that such variations and alternatives may be within the scope of the invention as defined by the appended claims.

What is claimed is:

1. A linear amplifier having variable delay means, said amplifier comprising:

first, second and third bipolar differential pairs;

first, second and third constant current sources connected to said first, second and third differential pairs respectively;

differential current outputs generated by said differential pairs;

gain linearizing offset provided by ratioed input emitter followers and associated current mirrors, a linear phase splitter receiving said differential current outputs and providing main current output and components of in-phase and 180° out-of-phase current; and a logarithmic tuning control for combining said components of in-phase and 180° out-of-phase current in inverse ratios to provide d.c. feedback current.

2. A linear amplifier as defined in claim 1, said phase splitter comprising ratioed bipolar transistors connected in cascode.

3. A linear amplifier as defined in claim 2, said feedback current being dependent on the ratio of the transistors in the phase splitter.

4. A linear amplifier as defined in claim 3, said logarithmic tuning control having a differential input control voltage.

5. A voltage controlled oscillator comprising a pair of linear amplifiers as defined in claim 4, with a positive output of a first amplifier connected to a positive input of a second amplifier, a negative output of said first amplifier connected to a negative input of said second amplifier, a positive output of said second amplifier connected to a negative input of said first amplifier and a negative output of said second amplifier connected to a positive input of said first amplifier.

6. A voltage controlled oscillator as defined in claim 5, said combined in-phase and 180° out-of-phase current of said first amplifier being summed at its input load resistor with said main current output of said second amplifier.

7. A voltage controlled oscillator as defined in claim 6, the feedback current controlling the oscillator tuning range.

8. A voltage controlled oscillator as defined in claim 7, the current mirrors associated with the input emitter followers having a bias input.

9. A voltage controlled oscillator as defined in claim 8, said bias input controlling the gain of each amplifier.

10. A voltage controlled oscillator as defined in claim 9, said input load resistor being tapped.

11. A voltage controlled oscillator as defined in claim 10, the resistor tap ratio being varied so as to provide a resonator with two port gain.

12. A ring resonator comprising a plurality of voltage controlled oscillators as defined in claim 11 said plurality of voltage controlled oscillators being serially connected in a closed loop.

* * * * *